United States Patent
Breme et al.

[11] Patent Number: 6,057,031
[45] Date of Patent: May 2, 2000

[54] PLASTIC SUBSTRATE WITH THIN METAL-CONTAINING LAYER

[75] Inventors: Frank Breme, Roettenbach; Volker Guether, Burgthann; Karl-Uwe van Osten, Allersberg, all of Germany

[73] Assignee: GfE Metalle und Materialien GmbH., Nuremburg, Germany

[21] Appl. No.: 09/137,815

[22] Filed: Aug. 21, 1998

[30] Foreign Application Priority Data

Aug. 21, 1997 [DE] Germany ............ 197 36 449

[51] Int. Cl.⁷ .......... B32B 18/00; B32B 27/32; B32B 27/34; B32B 27/36; B32B 27/40
[52] U.S. Cl. .......... 428/336; 428/422; 428/425.9; 428/458; 428/461; 428/477.7; 428/480; 428/500; 428/698; 428/702; 428/421; 427/2.24; 427/2.26; 427/2.27; 427/2.31; 427/532; 427/534; 427/585; 427/586; 427/587; 427/590; 427/576; 427/577
[58] Field of Search .......... 428/334, 335, 428/336, 421, 422, 425.9, 458, 461, 477.7, 480, 500, 698, 702; 427/2.24, 2.26, 2.27, 2.31, 532, 534, 576, 577, 585, 587, 586, 590

[56] References Cited

U.S. PATENT DOCUMENTS

| | | | |
|---|---|---|---|
| 5,260,107 | 11/1993 | Kawamura et al. | 427/577 |
| 5,290,609 | 3/1994 | Horiike et al. | 427/576 |
| 5,607,463 | 3/1997 | Schwartz et al. | 623/1 |

FOREIGN PATENT DOCUMENTS

| | | |
|---|---|---|
| 1337484 | 10/1995 | China . |
| 0267679 | 5/1988 | European Pat. Off. . |
| 19506188 | 8/1986 | Germany . |
| 3905417A1 | 8/1990 | Germany . |
| 9108322 | 6/1991 | WIPO . |
| 9116378 | 10/1991 | WIPO . |
| 9520982 | 8/1995 | WIPO . |
| 9521212 | 8/1995 | WIPO . |

OTHER PUBLICATIONS

Patent Abstract of JP 4–159338 filed Jun. 2, 1992.

*Primary Examiner*—Vivian Chen

[57] ABSTRACT

The invention relates to a composite composed of a plastic substrate and a thin, continuous metal-containing layer, characterised in that the metal-containing layer is ductile, adheres firmly to the plastic substrate, has a thickness of <2 μm and is composed of a compound corresponding to the formula $$M_a O_b C_x N_y B_z$$

wherein:
 M means one or more metals from the group comprising Ti, Ta, Nb, Zr and Hf,
 a=0.025 to 0.9
 b=0.025 to 0.7
 x=0.2 to 0.9
 y=0 to 0.7
 z=0 to 0.7
 a+b+x+y+z=1 provided that the value of a, starting from the substrate surface, increases from a value approximating zero towards to the layer surface, and at least 50% of the carbon atoms at the base of the layer are bound to other carbon atoms by C—C bonds.

11 Claims, 3 Drawing Sheets

PLASTIC SUBSTRATE WITH THIN METAL-CONTAINING LAYER

The present invention relates to a composite of a plastic substrate and a firmly adhering thin metal-containing layer. The metal-containing layer is composed of at least one metal from the group comprising Ti, Ta, Nb, Zr and Hf and a proportion of at least one of the elements C, B, N, O. The invention also relates to a process for the preparation of such a composite. The composites according to the invention may be used in particular in medical engineering.

BACKGROUND OF THE INVENTION

The use of plastics in medical engineering is often restricted due to inadequate surface properties. This concerns, in particular, the bio- and haemocompatibility of, e.g., vascular prostheses, catheters or sensors. Despite great endeavours up to the present day, vascular prostheses made of plastics with a diameter of >6 mm may be used only on a restricted basis in view of the risk of thrombosis that nevertheless exists, and under no circumstances may vascular prostheses with a diameter of <6 mm be used. The very large applications sector of artificial coronary vessels relates however, to a diameter of <6 mm (see R. Zdrahala: Small Caliber Vascular Grafts, J. of Biomaterials Appl., Vol. 10, no. 4, Apr. 1996, p. 309–329).

Even when catheters are used, although these are usually only briefly in contact with the body, complications arise in many cases due to the lack of compatibility of plastics with the body, which can mean a series risk to the patient (see R. Dujardin, Polymerstruktur und Thrombogenität, in Symposium Materialforschung-Neue Werkstoffe p. 724–749, PLR Jüjlich 1994). The use of plastics is, however, unavoidable in many areas of medical engineering in view of their advantageous mechanical properties.

It is well known that materials based on titanium, niobium, tantalum, zirconium or hafnium have biocompatible properties (see Clarke E. G. and Hickman J., An investigation into the correlation between the electrical potential of metals and their behaviour in biological fluids, J. Bone Joint Surg., Vol. 35B (1953) 467). Moreover, the excellent haemocompatibility of titanium nitride was demonstrated (see Y. Mitamura, Development of a ceramic heart valve, in J. of Biomaterials Applications, Vol. 4 July 1989, p. 33–55). As yet, however, no material has existed which has both the advantageous mechanical properties of plastics and the outstanding compatibility properties of the compounds based on Ti, Ta, Nb, Zr and Hf.

It is well known that, as a result of chemical vapour deposition (CVD), it is also possible to coat substrates with a complicated geometry, of the kind used in medical engineering. However, in the case of the inorganic starting substances mostly used hitherto for coating, reaction temperatures of >600° C. are required with the materials under consideration (see S. Siveram, Chemical Vapor Deposition, Van Nostrand Reinhold, New York 1995). Moreover, it is well known that coating temperatures of about 300° C. may be used as a result of using organometallic or metallo-organic starting substances (see Sugiyama: Low Temperature Deposition of Metal Nitrides by Thermal Decomposition of Organometallic Compounds, J. Electrochem. Soc., September 1975, p. 1545–1549). Moreover, it was reported that the coating temperatures may be reduced markedly by the use of lasers or by coupling a low-pressure plasma. The lowest known coating temperature of the materials in question is given as 150° C. in connection with the deposition of Ti(C, N) and Zr (C, N) from Ti[N(CH$_3$)$_2$]$_4$ and Zr[N(CH$_3$)$_2$]$_4$ by plasma-activated CVD (PACVD), whereby a pulsed source of excitation of direct current was used to produce the plasma (see K -T. Rie et al., Studies on the synthesis of hard coatings by plasma-assisted CVD using metallo-organic compounds, Surface and Coating Technology 74–75 (1995), p. 362–368). This coating was applied to prevent wear on metallic substrates on which sufficient adhesion can be achieved without difficulty.

An implant for use in the human body is known from DE-A-195 06 188 which is composed of a substrate and a metal-containing coating. Although plastics are mentioned as substrate, metals are used as substrates in the examples. The coating may be applied both by CVD and PVD (physical vapour deposition).

The PVD process is preferred because it is pointed out in the introductory part of DE-A-195 01 188 that considerable heating of the substrate is required in the CVD process. As part of the teaching of DE-A-195 06 188, the CVD process is not, therefore, considered for coating plastics because these would be destroyed at the high temperatures mentioned. The PVD coatings described in DE-A-195 06 188 have substantial shortcomings:

It is very difficult and expensive (if not impossible) to coat complicated geometries such as e.g. textile implants (vascular prostheses, plastic nets for treating inguinal hernias etc. ) by PVD. The expert knows this phenomenon as the "shadowing effect".

Roughening and/or an intermediate layer is usually required for sufficient adhesion (see, for example, claims 12 to 14 of DE-A-195 06 188).

The layers are more or less porous, which is disadvantageous for corrosion resistance. Moreover, unwanted adsorption of, for example, blood constituents, may occur easily through the pores.

A process for the chemical vapour deposition of transition metal nitrides on various substrates is known from WO 91/08322. Preferred substrate temperatures are between 200 and 250° C. In Example 6, polyester sheets which are kept at a temperature of 150° C. and coated with titanium nitride are used as substrate. Ammonia must be used as reaction gas in this process. The addition of the extremely reactive ammonia unavoidably leads, however, to unwanted gas reactions (see S. Intemann, "Eigenschaften von CVD-Titanverbindungsschichten aus metallorganischen Verbindungen für die Mehrlagenmetallisierung höchst integrierter Bauelemente" ("Properties of CVD titanium compound layers of metallo-organic compounds for multi-layer metallisation of highly integrated building components"), Dissertation TU Munich 1994), which in turn leads to an uneven layer build up and a very pronounced shadowing effect, with the result that the advantages of the CVD process over the PVD process are destroyed.

As yet, therefore, there is no known satisfactory process with which plastics may be coated in a satisfactory manner with metal-containing layers by CVD. Either the substrate temperatures required for coating are too high and lead to deterioration of the plastic substrate, or the known processes lead to coatings which are unsatisfactory. An overriding prejudice amongst experts was that composites cannot be produced from soft substrates and hard coating materials.

Thus, A. Bolz describes in his dissertation, Physikalische Mechanismen der Festkörper-Protein-Wechselwirkung an der Phasengrenze a-SiC—H-Fibrinogen [Physical mechanisms of solid-protein interaction at the a-SiC—H-fibrinogen interface], University of Erlangen-Nuremberg, 1991, that it is not possible to coat soft substrates such as, e.g., plastics, with hard coating materials such as, e.g., SiC on account of the "feather bed effect" which occurs.

SUMMARY OF THE INVENTION

The object of the present invention is to provide a composite of a plastic substrate and a thin, firmly adhering continuous metal-containing layer based on Ti, Ta, Nb, Zr and Hf and to create a process with which it is possible to produce such a composite. The need was to develop a coating process which meets the following requirements:

No damage to the plastic substrate by the coating process, particularly by excessive thermal stress, Adequate adhesion of the layer, despite the extreme differences in the properties of the layer and the substrate, such as thermal expansion and elasticity, Smooth surface of the layer in order to minimise interactions, such as, e.g., adsorption of body fluids.

The composites produced must have a biocompatible behaviour towards soft tissue, bone, blood, etc., must have adequate resistance to corrosion and moreover, must normally have an antithrombogenic behaviour.

The object is achieved by a composite composed of a plastic substrate and a thin, continuous metal-containing layer, characterised in that the metal-containing layer is ductile, adheres firmly to the plastic substrate, has a thickness of <2 μm and is composed of a compound corresponding to the formula $$M_aO_bC_xN_yB_z$$

wherein:

M means one or more metals from the group comprising Ti, Ta, Nb, Zr and Hf, a=0.025 to 0.9 b=0.025 to 0.7 x=0.2 to 0.9 y=0 to 0.7 z=0 to 0.7 a+b+x+y+z=1 provided that the value of a, starting from the substrate surface, increases from a value approximating zero towards the layer surface, and at least 50% of the carbon atoms at the base of the layer are bound to other carbon atoms by C—C bonds. Towards the layer surface, the carbon atoms may be bound increasingly to completely to metal atoms by M—C bonds, or be present in C—C bonds.

Such a composite may be produced by a) cleaning the plastic substrate, b) selecting a suitable metallo-organic or organometallic starting compound, c) converting the metallo-organic or organometallic starting compound, if it is not gaseous, to the gas phase, d) conveying the gaseous metallo-organic or organometallic compound starting compound by means of a carrier gas into a reactor in which is situated the plastic substrate, e) passing energy to the substrate by heating, plasma coupling, laser radiation, etc., such that a temperature of 100° is not exceeded, and f) maintaining a pressure of 0.1 to 1030 mbar in the reaction chamber, and a pressure of <50 mbar if a plasma is used.

As a result of the present invention it is possible, despite the extreme differences in properties between plastic substrate and metal-containing coating, to apply layers having good adhesion, as a result of which a substantial improvement in the surface properties compared with the uncoated plastics may be achieved and plastics may thus be used in medical engineering for, for example, blood vessels and the like.

Adhesion is a major problem because the materials suitable for coating differ substantially from plastics in terms of their properties. These are, e.g., the thermal expansion coefficient which is greater by a factor of about 100 in the case of plastics, and thermoformability. Due in particular to the different expansion behaviour, substantial stresses may occur in the boundary layer which ultimately leads to bursting of the layers applied. These boundary layer tensions may be minimised by a fluid transition in the composition. This is achieved by the coating process developed according to the invention.

Compared with the layers applied by PVD, details about which were reported further above in connection with DE-A-195 06 188, the composites according to the invention whose layers are deposited by CVD have important advantages:

The adhesion is obtained by C—C bonds at the base of the layer and by the graduated build up of the coating, as a result of which a "smooth" transition from the plastic substrate to the ceramic layer is achieved. The presence of the C—C bonds at the base and of the M—C bonds at the surface of the layer may be determined by XPS analyses (XPS=Xray photoelectron spectroscopy).

As a result of this build up, no roughening of the substrate is required to increase the adhesion.

The layers are extremely smooth ($R_a$=0.001 μm) and continuous. As a result, the exchange surface is smaller than with rougher and porous layers. This leads to better corrosion resistance and bio- and haemocompatibility than with rougher and porous layers.

DETAILED DESCRIPTION

Suitable plastic substrates of the composites according to the invention are, in particular, polyethylene terephthalate (PET), polyurethane (PUR), polytetrafluoroethylene (PTFE), polyamide (PA) and polypropylene (PP) which have also been used hitherto for the production of vascular prostheses (see R. Zdrahala: Small Caliber Vascular Grafts, Part 1: State of the Art; Journal of Biomaterials Applications, Vol, 10, April 1996, pages 309–329).

Other plastics which may be suitable for the present purposes are polyetherether ketone (PEEK), polysulfone (PSU), polybutylene terephthalate (PBT), polyether sulfone (PES), polyimide (PI), polycarbonate (PC), polyether imide (PEI), polyamide imide (PAI) and the like, and silicones. All these plastics are stable at a temperature of about 100°, at which coating with the metal-containing layer takes place.

The thin metal-containing layer which has a thickness of <2 μm is situated on the plastic substrate. Preferably, the layer thickness is within a range from 5 to 700 nm, particularly within a range from 5 to 500 nm.

The metal-containing layer is composed of a metal compound corresponding to the formula $$M_aO_bC_xN_yB_z$$

M means one or more metals from the group Ti, Ta, Nb, Zr and Hf, a means 0.025 to 0.9; b means 0.025 to 0.7; x means 0.2 to 0.90; y means 0 to 0.7 and z means 0 to 0.7.

a+b+x+y+z together are equal to 1.

Depending on the carrier gas used, a certain proportion of hydrogen may be present in the layers.

Figure 1:
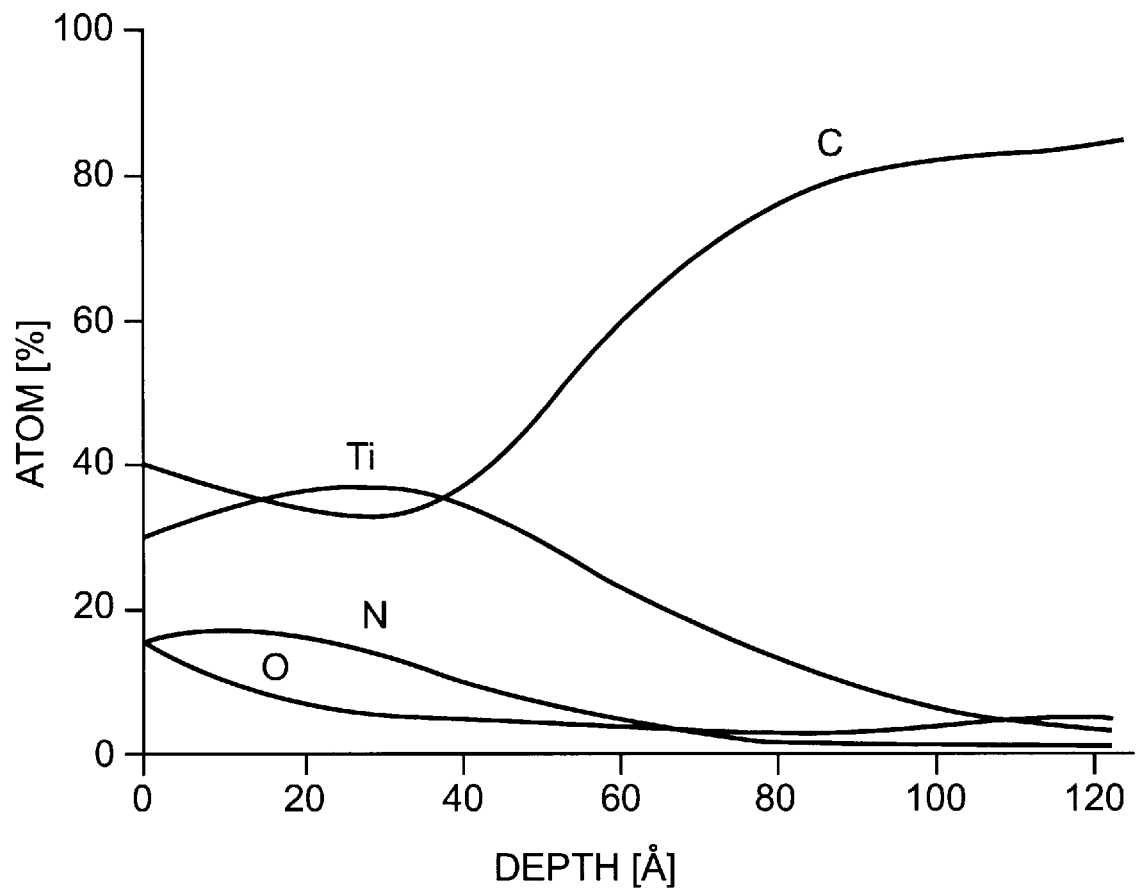
FIG. 1 is an XPS analysis of the coating as a function of the layer depth immediately after coating

A further provision is that the value of a increases, starting from the substrate surface, from a value approximating 0 to the layer surface. This is important for good adhesion of the metal-containing layer of a substrate surface. The carbon content is particularly high at the base of the metal-containing layer, that is, near the substrate surface; x usually assumes a value of approximately 0.9. As the layer thickness increases, the composition of the metal-containing layer alters considerably. The proportion of carbon decreases, whilst the proportions of metal, optionally nitrogen, boron and oxygen increase. The composition altering with the layer thickness is represented in FIG. 1 taking a layer containing titanium as an example. A description is given further below of how this layer build up may be produced in detail.

The following preferably applies for the values of a, b, x, y and z:

(i) at the base of the metal-containing layer:
a=0.025–0.1
b=0.025–0.2
x=0.8–0.9
y=0–0.1
z=0–0.1

(ii) as the thickness of the metal-containing layer increases, the value of a increases, and (iii) near the surface of the metal-containing layer:
a=0.2–0.9
b=0.025–0.7
x=0–0.7
y=0–0.7
z=0–0.5

After storage in the air, the composition of the metal-containing layer alters in its uppermost regions. Carbon and oxygen increase, whilst the proportions of metal and nitrogen decrease slightly. This change is represented in FIG. 2, likewise taking a layer containing titanium as an example.

Figure 2:
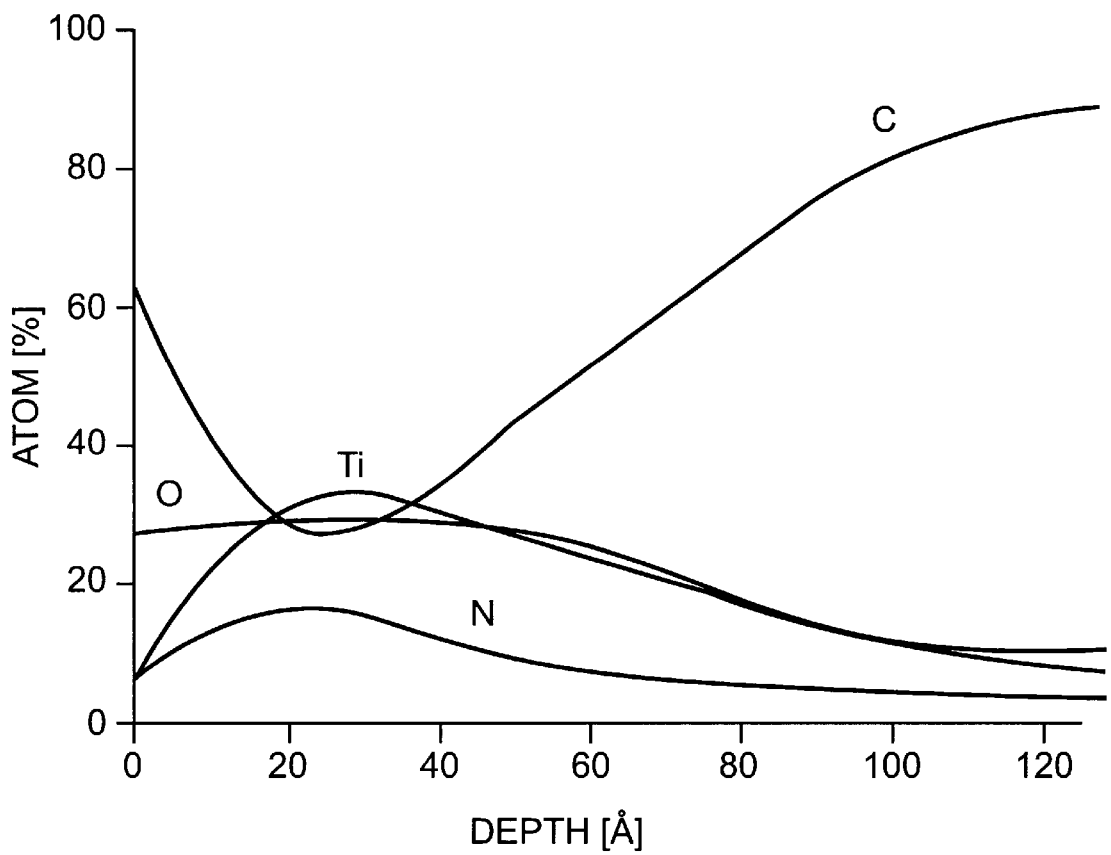
FIG. 2 is a corresponding analysis after two weeks' storage of the coated substrate in the air.

The layer compositions of FIGS. 1 and 2 were determined by XPS (X-ray photoelectron spectroscopy). The depth profiles were recorded by sputtering the layers with $Ar^+$.

One of the few criteria known hitherto for good haemocompatibility, apart from a smooth surface, is a minimum conductivity of $L>10^{-4}$ $(Ohm.cm)^{-1}$ (see A. Bolz, Physikalische Mechanismen der Festkörper-Protein-Wechselwirkung an der Phasengrenze a-SiC—H-fibrinogen [Physical mechanisms of solid-protein interaction at the a-SiC—H-fibrinogen interface], Dissertation, University of Erlangen-Nuremberg, 1991). According to the invention, conductivities of the metal-containing layer of L=2.1 $(Ohm.cm^{-1})$ were measured immediately after its production. After 3 days storage in the air, L=0.18 $(Ohm.cm)^{-1}$.

Roughness measurements at the layer surfaces revealed that these are extraordinarily smooth. In the case of the layer surfaces according to the invention, the roughness value $R_a$=0.001 μm was measured. In comparison, the roughness values of the only CVD layers described in the literature for increasing the haemocompatibility are much higher, namely: $R_a$=0.43 μm and $R_t$=2.1 μm (see I. Dion, TiN coating: Surface Characterization and Haemocompatibility, Biomaterials, Vol. 14, no. 3, 1993, pages 169–176).

The layers according to the invention adhere extraordinarily firmly to the plastic substrate. Measurements have revealed a bond strength in tension of >6 $N/mm^2$ (failure of the adhesive in the peel test).

In order to achieve good adhesion between metal-containing coating and plastic substrate, it is necessary to remove impurities from the plastic substrate before coating (for example, lubricants from the production process, impurities from the packaging material, etc.). This may be carried out, for example, by the use of liquid cleaning agents, but cleaning is carried out advantageously using a low-pressure plasma (see, e.g., A. Mann, Plasmamodifikation von Kunststoffoberflächen zur Haftfestigssteigerung von Metallschichten [Plasma modification of plastic surfaces in order to increase the adhesion of metal layers], Dissertation, University of Stuttgart, 1993). In the low-pressure plasma, the gases are excited (ionisation, radical formation) and meet the substrate or the impurity with a high level of kinetic energy at times. As a result, the impurities are removed or decomposed and may be transported away via the gas phase. As a result of this treatment process, moreover, the substrate surface may be activated, which ultimately leads to increased adhesion.

Suitable starting materials for the production of the metal-containing layer are numerous metallo-organic and organo-metallic compounds. In the case of the metals titanium, zirconium and hafnium, for example, the following groups of compounds may be considered:

Amido compounds: e.g. $M[N[CH_3]_2]_4$, $M[N[C_2H_5]_2]_4$, $M[N(CH_2)(C[CH_3]_2)]_4$ Imido compounds: e.g. $((N^tBu)M[N(CH_3)_2]_2)_2$, $((N^tBu)M[N(C_2H_5)_2]_2)_2$ Compounds with an M—C bond: e.g. $M(CH_2{}^tBu)_4$, $(C_5H_5)_2MCl_2$ with M=Ti, Zr or Hf.

The following groups of compounds are suitable for the metals tantalum and niobium:

Amido compounds: e.g. $M[N[CH_3]_2]_5$, $M[N[C_2H_5]_2]_5$,

Imido compounds: e.g. $[N[C_2H_5]_2]_3M=N^tBu$ with M=Ta or Nb.

If the starting substances are not in the gaseous form, they must be converted to the gas phase. A carrier gas is used to transport the starting substances into the reaction chamber. Suitable carrier gases are, for example, nitrogen and hydrogen, and all the noble gases. The carrier gases may also be reaction gases, e.g., nitrogen.

A pressure of about 0.1 to 1030 mbar is maintained in the reactor. If a plasma is used, the pressure should be <50 mbar in order to avoid excessively high temperatures as a result of the plasma.

Figure 3:
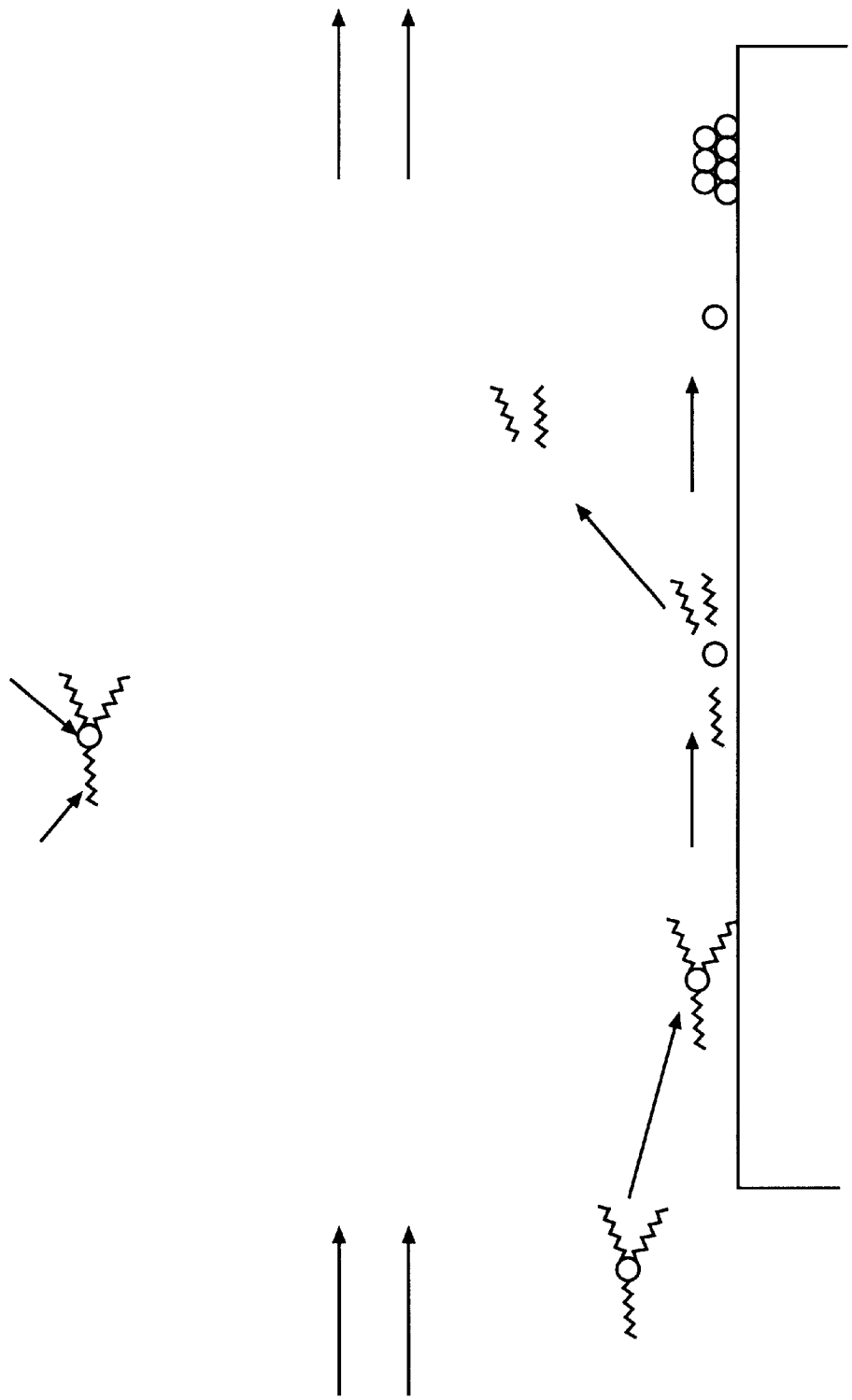
FIG. 3 is a schematic representation of the coating process according to the invention.

The plastic substrate to be coated situated in the reactor is usually heated directly. The temperature should not be more than 100° C. otherwise the plastic substrate may be damaged. Additional energy is provided e.g. by coupling a plasma or by means of a laser. The starting substances situated in the gas chamber reach the substrate surface where they are deposited by decomposition and reaction. A schematic representation of the process may be derived from FIG. 3. Initially, the starting substances are transported inwards (1) by means of a carrier gas. As a result of diffusion and adsorption (2), the starting substance reaches the substrate surface where a reaction (3) of the starting substances takes place. Volatile radicals split off are returned by diffusion (4) to the gas phase and transport outwards (5) then takes place. The reaction product containing metal is, on the other hand, deposited on the surface of the substrate.

Initially, the effect of the coupled plasma is small and the substance initially deposited on the substrate surface still contains substantial quantities of carbon. These compounds have a great affinity with the surface of the plastic substrate and may diffuse into the latter in some cases, as a result of which considerable adhesion occurs. As the coating of the substrate increases, the effect of the plasma increases, more energy is available, and the conversion reactions of the starting substances take place even more completely, i.e. less and less carbon but in percentage terms more metal is incorporated in the layer.

Ultimately, this leads to an intimate firm bond between the plastic substrate surface and the metal-containing layer being obtained as a result of the high carbon content of the layer initially deposited.

The final composition of the metal-containing layer is reached with a layer thickness of about 20 nm. As the layer thickness increases, the composition no longer alters. Only after the coating process is discontinued is there still a slight change in the composition in the outermost part of the metal-containing layer, as FIGS. 1 and 2 show.

The scheme below shows the reaction, increasing stepwise taking the starting compound $Ti[N(CH_3)_2]_4$ as an example, as a function of the increasingly available energy for the reaction:

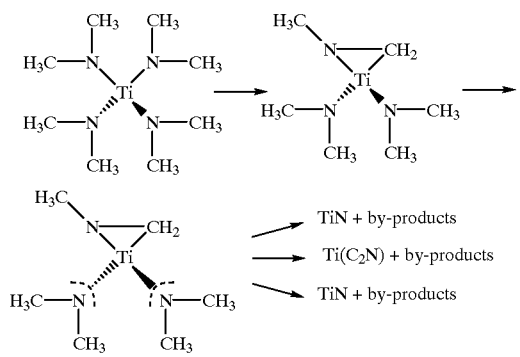

As can be derived from FIG. 1, the metal-containing layer in a layer depth of about 2 nm, which corresponds in terms of time to the discontinuation of the coating reaction, is composed of about 40 atom-% Ti, 35 atom-% C, 15 atom-% N and 10 atom-% O. Such a composition has an extraordinarily favourable haemocompatibility, so that coated plastic substrates of such a kind are outstandingly suitable for artificial vascular implants.

With the process according to the invention, it has become possible for the first time to reduce the coating temperatures to about 100° C. and thus to maintain the required temperatures at which the plastic substrate does not become damaged. In particular, if hydrogen is used as carrier gas, very low coating temperatures are possible.

As is shown in FIG. 2, the surface of the metal-containing layer adsorbs oxygen during the course of time. If this is to be avoided, an aftertreatment in the nitrogen plasma is suitable. This leads to a marked increase in the nitrogen content of the surface of the metal-containing layer, and a considerable reduction in the subsequent oxygen adsorption occurs as a result.

As a result of the process of the invention, a coating of plastic substrates with complicated geometries is possible since the starting substance comes into contact uniformly with the substrate to be coated prior to the reaction. The concentration of the starting compound is relatively low in the reaction chamber in order to achieve the earliest possible union of the layers and hence the smallest possible layer thickness. This leads to an extremely smooth surface of the layer, as a result of which the outstanding compatibility towards body fluids such as, e.g., blood, is guaranteed.

As a result of the invention, biocompatible surfaces with very good electrical conductivity may be produced on otherwise non-conducting plastics, as a result of which a plurality of new fields of application is opened up in medical engineering.

EXAMPLE

Initially, the surface of the plastic substrate to be coated was cleaned in a low-pressure plasma. To this end, nitrogen was introduced into the reactor at a rate of about 5 l/h n.t.p, a pressure of about 1 mbar being maintained in the reactor by means of a vacuum pump. An inductive plasma was coupled at a frequency of 13.56 MHz with 50 W by means of an external copper ring. The treatment time was about 3 min (it may be reduced if necessary).

The liquid organometallic starting compound used was $Ti[N(CH_3)_2]_4$. A stream of pure hydrogen was passed through the starting compound at 5° C. An excessively high concentration of the starting substance in the reaction chamber and hence an uneven layer build up was avoided by the cooling provided by the condenser.

The hydrogen loaded with the starting substance flows into the reactor in which is situated the plastic substrate (PET) pretreated in the low-pressure plasma, heated to about 100° C. The reaction of the starting compound is initiated by an additional input of energy, namely by coupling a low-pressure plasma. The plasma is inductively coupled at a frequency of 13.56 MHz by means of the external copper ring at a pressure in the reaction chamber of about 1 mbar. As a result, the gas in the vicinity of the substrate is partially ionised, or radical formation takes place. A crucial factor here is that the gas temperature itself is increased only to a minor extent by the reduced pressure in the gas chamber; however, particles are contained in the gas which are extremely energy-rich and the reaction may thus be initiated at temperatures which are considerably reduced.

Initially, only a partial reaction of the starting substance takes place, and the initial layer structure is composed of a metal-containing compound which is still very rich in carbon, whilst the other constituents such as the metal and the nitrogen are present only in small proportions in terms of percentage. This leads to particularly good adhesion to the plastic substrate which is intensified further by diffusion of the initially deposited particles into the plastic.

As a result of the incipient build up of the metal-containing layer, the surface properties of the substrate alter and the effect of the coupled plasma on the substrate, now already partially coated, increases. Due to the increasingly favourable energy conditions, further reactions of the starting compounds take place, i.e. the composition of the deposited layers alters during the course of time, the carbon content decreasing constantly whilst the nitrogen and metal content increases.

The coating process was discontinued at a layer thickness of about 10 nm. FIG. 1 shows, in a layer depth of about 2 nm, a composition composed of about 40 atom-% Ti, 35 atom-% C, 15 atom-% N and 10 atom-% O. This layer composition corresponds, in terms of time, to the discontinuation of the coating process. As the reaction subsides, the composition again alters slightly, as may also be derived from FIG. 1.

The composite obtained was examined for its layer composition by XPS (X ray photoelectron spectroscopy). The depth profiles were recorded by sputtering the layers with $Ar^+$. The result is shown in FIG. 1.

Another examination of the layer composition after the composite had been stored in the air revealed, after 2 weeks, a composition that corresponds to FIG. 2. The carbon content and also the oxygen content had increased due to the oxygen adsorption and surface impurities.

A measurement of the conductivity of the layers immediately after coating revealed a value of $L=2.1$ $(Ohm.cm)^{-1}$ and after 3 days storage in air a value of $L=0.18$ $(Ohm.cm)^{-1}$.

The bond strength in tension of the metal-containing layer to the plastic substrate was also measured. Values of >6 $N/mm^2$ were measured. That is, the adhesive failed in the peel test, whereas the metal-containing layer remained adhering to the plastic substrate.

Finally, roughness measurements of the metal-containing layers were carried out according to the process described in the above-mentioned article by Dion et al. The value of $R_a=0.001$ μm was obtained.

We claim:

1. A composite composed of a plastic substrate and a thin, continuous metal-containing layer, wherein the metal-containing layer is ductile, adheres firmly to the plastic substrate, has a thickness of less than 2 μm and is composed of a compound corresponding to the formula

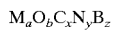

$$M_aO_bC_xN_yB_z$$

wherein:

M means one or more metals selected from the group consisting of Ti, Ta, Nb, Zr and Hf,
a=0.025 to 0.9
b=0.025 to 0.7
x=0.2 to 0.9
y=0 to 0.7
z=0 to 0.7
a+b+x+y+z=1
provided that the value of a, starting from the substrate surface, increases from a value approximating zero towards to the layer surface, and at least 50% of the carbon atoms at the base of the layer are bound to other carbon atoms by C—C bonds.

2. A composite according to claim 1, wherein the plastic substrate is composed of polyethylene terephthalate, polyurethane, polytetrafluoroethylene, polyamide or polypropylene.

3. A composite according to claim 1 wherein M=Ti.

4. A composite according to claim 1 wherein the following applies to the values of a, b, x, y and z:

(i) at the base of the metal-containing layer:
a=0.025–0.1
b=0.025–0.2
x=0.8–0.9
y=0–0.1
z=0–0.1

(ii) as the thickness of the metal-containing layer increases, the value of a increases, and (iii) near the surface of the metal-containing layer:
a=0.2–0.9
b=0.025–0.7
x=0–0.7
y=0–0.7
z=0–0.5.

5. A composite according to claim 1, wherein the layer additionally contains hydrogen.

6. A process for the production of a composite according to claim 1, wherein a) the plastic substrate is cleaned, b) a suitable metallo-organic or organometallic starting compound is selected, c) the metallo-organic or organometallic starting compound, if it is not gaseous, is converted to the gas phase, d) the gaseous metallo-organic or organometallic compound starting compound is conveyed by means of a carrier gas to a reactor in which is situated the plastic substrate, e) energy is passed to the substrate by heating, plasma coupling or laser radiation etc. in such a way that a temperature of 100° C. is not exceeded, and f) a pressure of 0.1 to 1030 mbar is maintained in the reaction chamber, and a pressure of less than 50 mbar if a plasma is used.

7. A process according to claim 6, wherein the carrier gas used is hydrogen.

8. A process according to claim 6, wherein the metallo-organic or organometallic compound used is $M[N[CH_3]_2]_4$, $M[N[C_2H_5]_2]_4$, $M[N(CH_2)(C[CH_3]_2)]_4$, $((N^tBu)M[N(CH_3)_2]_2)_2$, $((N^tBu)M[N(C_2H_5)_2]_2)_2$, $M(CH_2{}^tBu)_4$ and/or $(C_5H_5)_2MCl_2$ where M=Ti, Zr or Hf.

9. A process according to claim 8, wherein the metallo-organic or organometallic compound used is $Ti[N(CH_3)_2]_4$.

10. A process according to claim 6 wherein the metallo-organic or organometallic compound used is $M[N[CH_3]_2]_5$, $M[N[C_2H_5]_2]_5$, and/or $[N[C_2H_5]_2]_3M\!\!=\!\!N^tBu$ where M=Ta or Nb.

11. A process according to claim 6, wherein a plasma is coupled in order to supply sufficient energy.

* * * * *